United States Patent
Duan et al.

(10) Patent No.: US 11,106,610 B2
(45) Date of Patent: Aug. 31, 2021

(54) SEPERATION OF LOW-POWER AND HIGH-SPEED ANALOG FRONT-END RECEIVERS

(71) Applicant: QUALCOMM Incorporated, San Diego, CA (US)

(72) Inventors: Ying Duan, San Diego, CA (US); Shih-Wei Chou, San Diego, CA (US); Mansoor Basha Shaik, Bangalore (IN); Harry Dang, San Diego, CA (US); Abhay Dixit, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/570,021

(22) Filed: Sep. 13, 2019

(65) Prior Publication Data
US 2021/0081339 A1    Mar. 18, 2021

(51) Int. Cl.
*G06F 13/20* (2006.01)
*H02H 9/04* (2006.01)
*H03K 3/023* (2006.01)

(52) U.S. Cl.
CPC .......... *G06F 13/20* (2013.01); *H02H 9/045* (2013.01); *H03K 3/023* (2013.01)

(58) Field of Classification Search
CPC ... G06F 3/00; G06F 5/00; G06F 12/00; G06F 13/00
See application file for complete search history.

(56) References Cited

U.S. PATENT DOCUMENTS

| | | | |
|---|---|---|---|
| 6,181,193 B1 | 1/2001 | Coughlin, Jr. | |
| 9,536,593 B1 | 1/2017 | Peterson et al. | |
| 2017/0317645 A1* | 11/2017 | Srinivas | H03B 1/04 |
| 2020/0057462 A1* | 2/2020 | Karunasiri | A61N 1/36125 |

OTHER PUBLICATIONS

EDN: "All You Need to Know About MIPI D'PHY RX", EDN Network, Sep. 8, 2015 (Sep. 8, 2015), XP055760420, 6 Pages, Retrieved from the Internet: URL:http://edn.com/all-you-need-to-know-about-mipi-dphy-rx [retrieved on Dec. 16, 2020] the Whole Document.
International Search Report and Written Opinion—PCT/US2020/050349—ISA/EPO—dated Jan. 12, 2021.
Lu Y-C., et al., "Low Power Multi-Lane MIPI CSI-2 Receiver Design and Hardware Implementations", , 2013 IEEE 17th International Symposium on Consumer Electronics (ISCE), IEEE, Jun. 3, 2013 (Jun. 3, 2013), XP032443802, pp. 199-200, DOI: 10.1109/ISCE.2013.6570183 ISBN: 978-1-4673-6198-9 the Whole Document.

* cited by examiner

*Primary Examiner* — Scott C Sun
(74) *Attorney, Agent, or Firm* — Qualcomm Incorporated

(57) ABSTRACT

In certain aspects, a device comprises one or more IO inputs; a first receiver coupled to a first supply voltage and the one or more IO inputs, wherein the first receiver comprises thick oxide transistors; and a high-speed circuit comprising: an isolation block coupled to the one or more IO inputs, wherein the isolation block comprises thick oxide transistors; and a second receiver coupled to the isolation block and a second supply voltage, wherein the second receiver comprises thin oxide transistors.

39 Claims, 8 Drawing Sheets

SEPERATION OF LOW-POWER AND HIGH-SPEED ANALOG FRONT-END RECEIVERS

BACKGROUND

Field

Aspects of the present disclosure relate to analog front-end receivers, and more particularly, to a dynamic switching scheme for separation of low-power and high-speed front-end receivers.

Background

Cellular and wireless devices have seen explosive growth over the past several years. The growth has been fueled by advanced communication technology, powerful computing capability, large screen, long lasting battery, and great camera, to name a few. Many smart phones today have cameras that are as good as professional cameras. The quality of a camera is not only defined by its resolution, lens aperture, lens zoom range, etc., but also by the speed the images and the video being processed by the processors and the power it consumes. Camera serial interface (CSI) connects the camera to the application processor or image signal processor. MIPI Alliance is a collaborative global organization serving industries that develop mobile and mobile-influenced devices. The widespread adoption places MIPI Alliance specifications in hundreds of millions of phones, contributing to the voice and data services that customers worldwide enjoy every day. MIPI Alliance offers camera and imaging interfaces, as well as a standardized camera command set. Each can be used to bring high-resolution imaging, rich color and advanced video capabilities to smartphones, tablets, automobiles, video game devices, camera drones, wearables and other products.

FIG. 1A illustrates an example CSI high-speed data transmission timing diagram for MIPI D-PHY, a popular PHY for cameras and displays in smartphones. D-PHY is a high-speed, low power, source synchronous physical layer which is best suited for power hungry battery operated devices due to its power efficient design. D-PHY includes both the high-speed and low-power modules which helps in achieving power efficiency. The payload image data use the high-speed modules whereas the control and status information is sent (between camera/display device and the application processor) with the help of low-power modules (utilizing low frequency signals). The configuration has a peculiar ability of sending the high-speed and low-power data in the single packet burst over the same physical link. The low-power modules help in achieving power savings and the high-speed modules help in achieving the much needed higher bandwidth requirement for the high definition picture quality data signals.

FIG. 1B illustrates an example CSI high-speed data transmission timing diagram for MIPI C-PHY. MIPI C-PHY is an embedded clock link that provides extreme flexibility to reallocate lanes within a link. MIPI C-PHY provides high throughput performance over bandwidth-limited channels to connect displays and cameras to an application processor. MIPI C-PHY can be used to connect low-cost, low-resolution image sensors, sensors offering up to 60 megapixels, as well as display panels offering 4K and higher resolution. MIPI C-PHY can be applied for many other use cases, such as automotive camera sensing systems, collision avoidance radars, in-car infotainment and dashboard displays. As illustrated in FIG. 1B, like MIPI D-PHY, MIPI C-PHY supports both the high-speed and low-power modules on the same physical link which helps in achieving power efficiency.

In order to meet both low-power and high-speed requirements, every data lane comprises a low-power transmitter (LPTX) and a high-speed transmitter (HSTX) at the transmitting side (e.g., camera), and a corresponding low-power receiver (LPRX) and a corresponding high-speed receiver (HSRX) at the receiving side (e.g., processor). The high-speed receiver (HSRX) is to receive the data stream that has higher data rate than the low-power receiver (LPRX). The Low-power modules often operate in single-ended manner and work on 1.2V logic voltage. The data rate of low-power signals, used for providing control and status information, is as low as or lower than 10 Mbps. The high-speed modules are required to support speed as high as 10 Gbps or higher and often operate in a differential manner. The high-speed modules utilize the low voltage swing of the payload data signals to transfer the information. A typical differential output swing of high-speed signals is around 200 mV. Therefore, low-power, high-speed, and reliable front-end receivers are required.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a device comprises one or more IO inputs; a first receiver coupled to a first supply voltage and the one or more IO inputs, wherein the first receiver comprises thick oxide transistors; and a high-speed circuit comprising: an isolation block coupled to the one or more IO inputs, wherein the isolation block comprises thick oxide transistors; and a second receiver coupled to the isolation block and a second supply voltage, wherein the second receiver comprises thin oxide transistors.

In another aspect, a method comprises receiving a signal through one or more IO inputs; determining if the signal is a high-speed signal or a low-power signal; and enabling a first receiver if the signal is a low-power signal or coupling the signal to a second receiver through an isolation block coupled to the one or more IO inputs if the signal is a high-speed signal, wherein the first receiver couples to a first supply voltage and comprises of thick oxide transistors, the second receiver couples to a second supply voltage and comprises of thin oxide transistors, and the isolation block comprises thick oxide transistors.

In yet another aspect, an apparatus comprises one or more IO inputs; a first receiver coupled to a first supply voltage and the one or more IO inputs, wherein the first receiver comprises thick oxide transistors; a second receiver coupled to a second supply voltage, wherein the second receiver comprises thick oxide transistors; and means for coupling or decoupling the second receiver to the one or more IO inputs.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

One of the most important features of smartphones is the camera. Year after year, smartphone cameras have become more capable and more versatile. As the camera resolution and speed increase, the requirement of transmitters and receivers of CSI increases. Today, receivers for CSI need to support both low-power and high-speed without compromising the reliability.

Figure 1A:
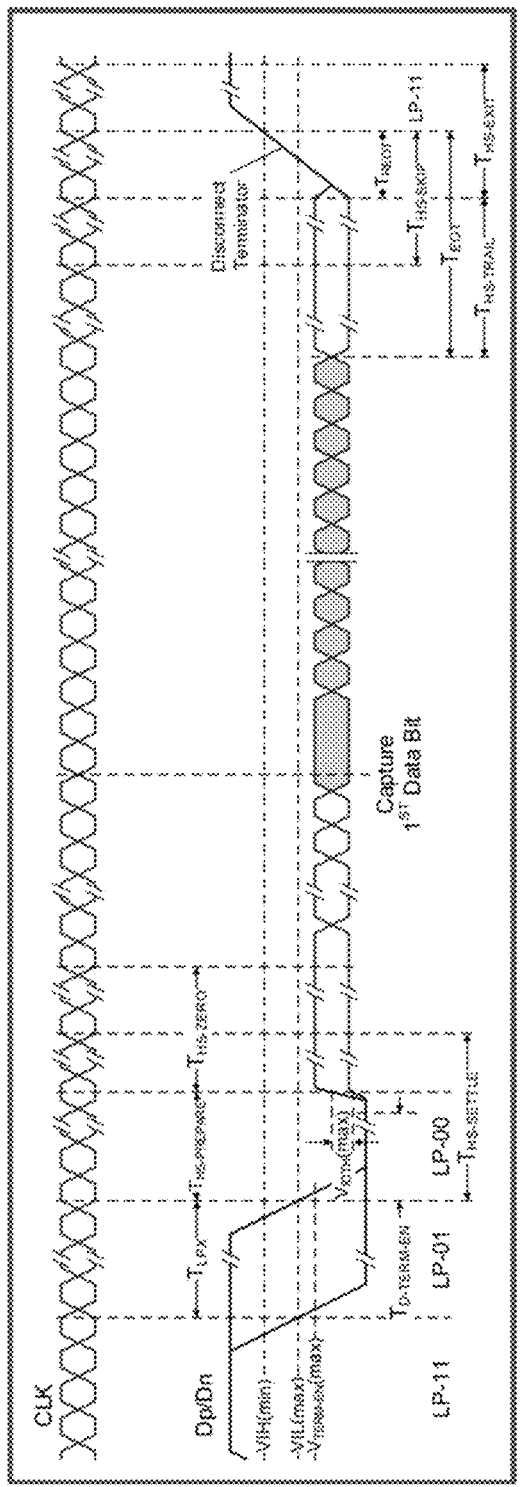
FIG. 1A illustrates an example CSI high-speed data transmission timing diagram for MIPI D-PHY.
Figure 1B:
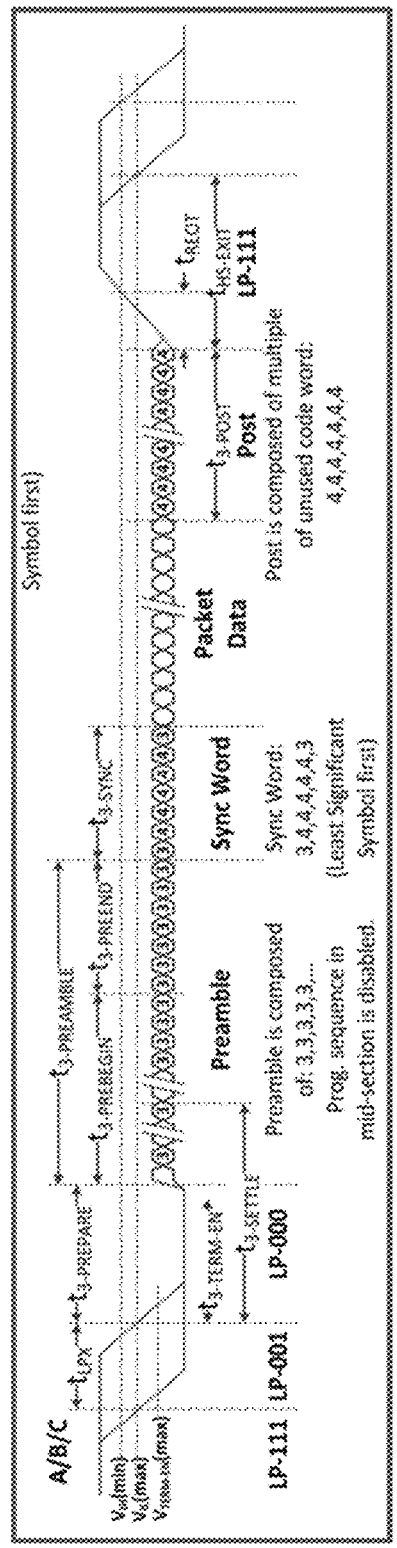
FIG. 1B illustrates an example CSI high-speed data transmission timing diagram for MIPI C-PHY.
Figure 2:
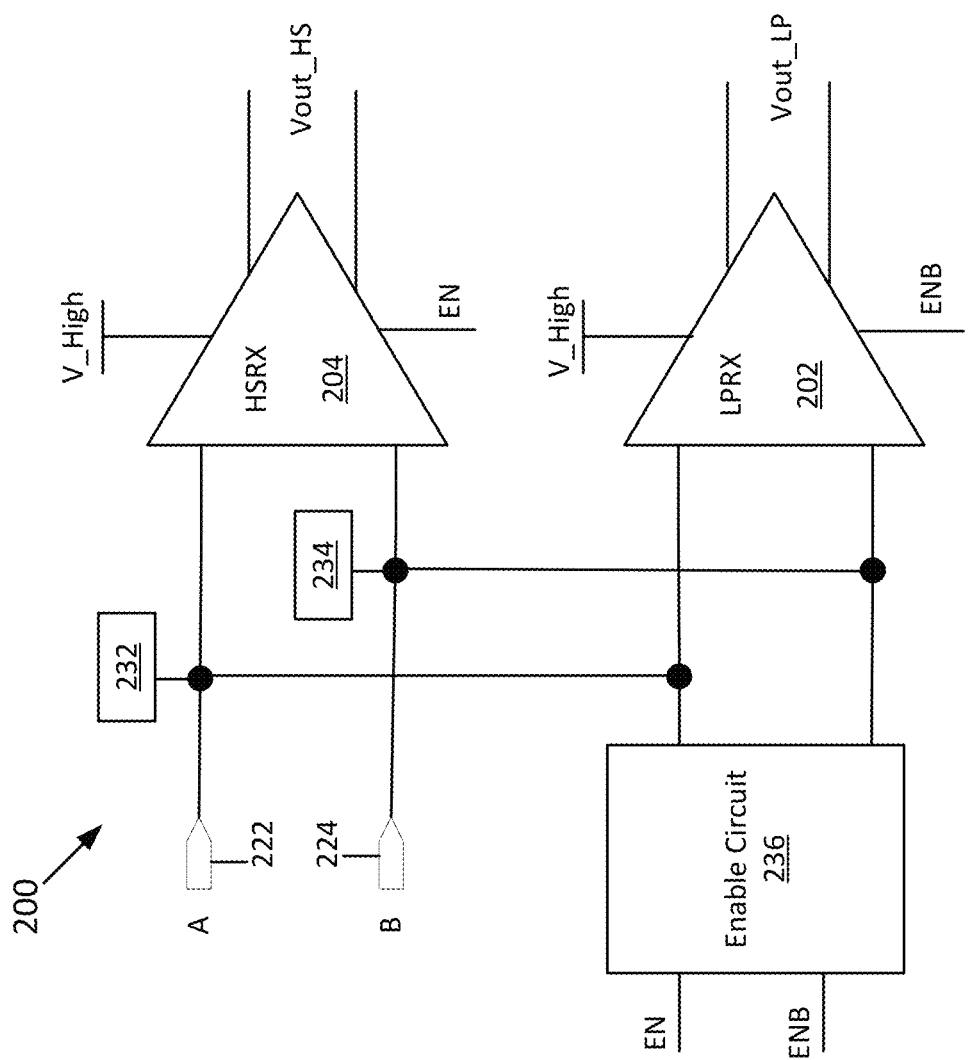
FIG. 2 illustrates an example CSI receiver circuit according to certain aspects of the present disclosure.

FIG. 2 illustrates an example CSI receiver circuit according to certain aspects of the present disclosure. The receiver circuit 200 comprises two receivers, a first receiver for low-power signal LPRX 202 and a second receiver for high-speed signal HSRX 204. Both LPRX 202 and HSRX 204 are coupled to one or more IO inputs, e.g., two IO inputs: a first IO input A 222 and a second IO input B 224. The one or more IO inputs, e.g., the first IO input A 222 and the second IO input B 224, are IO pins or pads that communicate between the chip and the external world, a component that is off-chip, such as a camera module (not shown). For such IO inputs, protection circuitry, ESD (Electrostatic Discharge) circuitry 232 and 234, are often needed. An I/O port allows communication with other pieces of equipment (other chips, test equipment, manufacture devices, etc.). The I/O ports for ICs comprise logical groups of pins that give access to equipment external to the system that contains the IC. These pins are subject to static discharge and other abuse as operators connect and disconnect pins from the system. The ESD circuitry may be current limiting resistors and/or diode clamps that couple to the first IO input A 222 and the second IO input B 224. In the event of an ESD strike, the ESD circuit, e.g, a diode, would breakdown and create a low impedance path that limits the peak voltage and current by diverting the current flow to ground, thereby protecting the IC.

Further, both LPRX 202 and HSRX 204 couple to an enable signal EN (or its complement ENB). For ease of explanation, in the subsequent discussion, we treat the enable signal EN and its complement ENB the same as one could derive from another by inversion. When an enable signal is used, it could mean the enable signal EN itself or its complement ENB, depending on whether the logic high of the signal would enable or disable the operation of the circuit. In response to enable signal EN, either LPRX 202 is enabled or HSRX 204 is enabled but not both. The enable signal EN may be generated based on the signal to the first IO input A 222 and the second IO input B 224 through an enable circuit 236 or derived by other means. If the input signal is a low-power signal, then LPRX 202 is enabled and HSRX 204 is disabled. If the input signal is a high-speed signal, then HSRX 204 is enabled and LPRX 202 is disabled.

The low-power data stream and the high-speed data stream are in the same channel as specified in CSI specification (e.g., MIPI Camera Serial Interface 2 (MIPI CSI-2)). As a result, LPRX 202 and HSRX 204 share the same CSI IO pads, such as the first IO input A 222 and the second IO input B 224. The high-speed data stream has relative low voltage level and low voltage swing. However, because the low-power mode operates at high voltage, the high-speed HSRX 204 in FIG. 2 is designed with thick oxide transistors (e.g., IO transistors), similar to the ones in low-power receiver LPRX 202 in order to meet reliability and ESD requirement. To drive the thick oxide transistors, or IO transistors, the HSRX 204 is provided with a high supply voltage, V_High. Similarly, enable signal EN is with high supply voltage. Such a design increases chip area and power consumption of high-speed receiver HSRX 204 and reduces the speed of the circuit.

Figure 3:
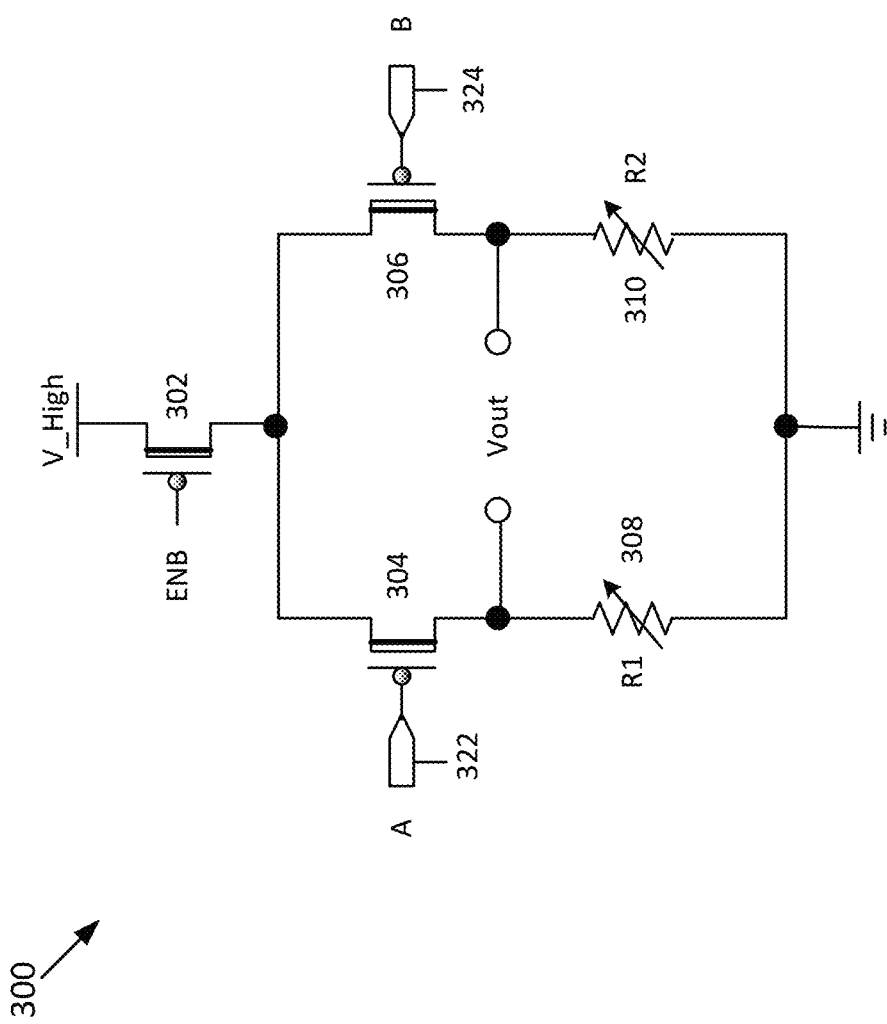
FIG. 3 illustrates an example CSI receiver according to certain aspects of the present disclosure.

FIG. 3 illustrates an example CSI receiver according to certain aspects of the present disclosure. The CSI receiver 300 may be used as either low-power receiver LPRX 202 or high-speed receiver HSRX 204. The CSI receiver 300 comprises a differential pair PMOS transistors 304 and 306. Each of PMOS transistors 304 and 306 couples to a first IO input A 322 and a second IO input B 324, respectively. Resistors R1 308 and R2 310 are used as load to the differential pair PMOS transistors 304 and 306, respectively. In addition, a PMOS transistor 302 couples to the differential pair and serves to generate a bias current. The gate of the PMOS transistor 302 couples to an enable signal ENB. When ENB is high, the PMOS transistor 302 is off, thus the CSI receiver 300 is disabled. When ENB is low, the PMOS transistor 302 produces a bias current and the CSI receiver 300 amplifies the signal applied on the first IO input A 322 and the second IO input B 324.

Because the CSI receiver 300 directly couples to the IO pads, the first input A 322 and the second input B 324, the transistors 302, 304, 306 are thick oxide transistors where they have better reliability to sustain high voltage and/or ESD events. In addition, the supply voltage, V_High, for the CSI receiver 300 is a high supply voltage or IO supply voltage. Note, typically, the differential pair in the CSI receiver 300 is often PMOS as the high-speed CSI data stream usually has low voltage level (or low common mode voltage). The CSI receiver 300 takes larger area and consumes more power than a receiver made of thin oxide transistors or core transistors.

Figure 4:
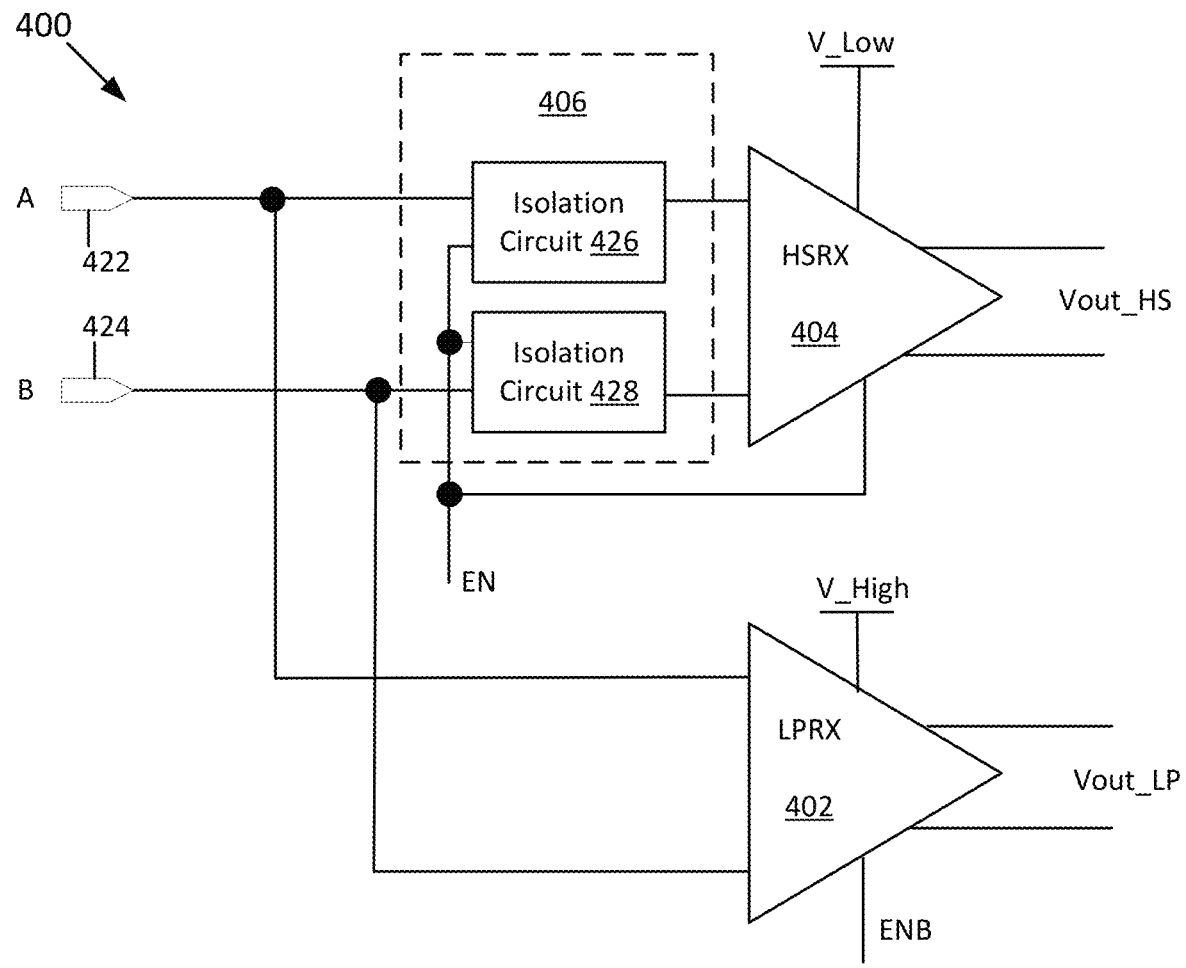
FIG. 4 illustrates an exemplary CSI receiver circuit according to certain aspects of the present disclosure.

FIG. 4 illustrates an exemplary CSI receiver circuit according to certain aspects of the present disclosure. Like the receiver circuit 200, receiver circuit 400 comprises two receivers, a first receiver for low-power signal, LPRX 402, and a second receiver for high-speed signal, HSRX 404. The first receiver LPRX 402 couples to one or more IO inputs, e.g., two IO inputs: a first IO input A 422 and a second IO input B 424. The one or more IO inputs, e.g., the first IO input A 422 and the second IO input B 424, are IO pins or pads that communicate between the chip and the external world, a component that is off-chip, such as a camera module (not shown). For such IO inputs, ESD protection circuitry are often needed. The ESD protection circuitry may be current limiting resistors and/or diode clamps that couple to the first IO input A 422 and the second IO input B 424. To meet the reliability and ESD requirement, the first receiver LPRX 402 is design with thick oxide transistors, or IO transistors, as compared to thin oxide, or core transistors.

In a typical process technology, there are at least two types of transistors. A first type of transistors is thin oxide, or core transistor. The thin or core transistors comprise the bulk of transistors in an integrated circuit chip. The thin or core transistors are often made with minimum channel length, thin oxide, and low threshold voltage, and often couple to low supply voltage for speed, density, and power efficiency. Another type of transistors, the thick oxide transistors, or IO transistors, has thicker gate oxide, longer channel length than typical thin oxide transistors or core transistors. The thick oxide transistors, or IO transistors, are often with higher threshold voltage. Therefore, such a circuit is often coupled to a first supply voltage, or IO supply voltage, V_High, which is relatively higher than a second supply voltage, or core supply voltage, V_Low. For example, IO supply voltage, V_High, for a particular technology may be 1.2V while core supply voltage, V_Low, may be 0.9V. In another example, IO supply voltage, V_High, for a particular technology may be 1.8V while core supply voltage, V_Low, may be 1.0V. The IO transistors are often used for off-chip interface circuits.

Unlike the receiver circuit 200, in receiver circuit 400, the second receiver for high-speed signal HSRX 404 does not directly couple to the one or more IO inputs, such as the first IO input A 422 and the second IO input B 424. Instead, an insolation block 406 is inserted between the second receiver HSRX 404 and the first IO input A 422 and the second IO input B 424. The isolation block 406 and the second receiver HSRX 404 together form the high-speed circuit. The isolation block 406 comprises a first insolation circuit 426 coupled to the second receiver HSRX 404 and the first IO input A 422 and a second insolation circuit 428 coupled to the second receiver HSRX 404 and the second IO input A 424. The first isolation circuit 426 and the second isolation circuit 428 couple to an enable signal EN. In response to the enable signal EN, the isolation block 406 either couples the second receiver HSRX 404 to first IO input A 422 and the second IO input B 424 or decouples the second receiver HSRX 404 to first IO input A 422 and the second IO input B 424.

Since the isolation block 406 couples to the IO pads, to meet the reliability and ESD requirement, the isolation block 406 is designed with thick oxide transistors, or IO transistors. The logic high of the enable signal EN is with high supply voltage or IO voltage, V_High, to drive the first isolation circuits 426 and the second isolation circuits 428.

With the isolation block 406, the second receiver HSRX 404 does not couple to IO pads directly. The second receiver HSRX 404 therefore may be designed with thin oxide transistors, or core transistors. Such transistors have thinner gate oxide, shorter channel length, lower threshold voltage and higher drive current compared to thick oxide transistors or IO transistors. In addition, the supply voltage to the second receiver HSRX 404 can be lowered to a second supply voltage or core supply voltage, V_Low, which is lower than the first supply voltage or IO voltage, V_High. The design thus achieves high-speed and low-power consumption without compromising the reliability. Such receiver is also more compatible with the high-speed data stream specified in CSI.

Further, the first receiver LPRX 402 couples to enable signal ENB. Likewise, the second receiver HSRX 404 may optionally couple to enable signal EN. In response to the enable signal EN, either LPRX 402 is enabled or HSRX 404 is enabled, and when one is enabled, the other is disabled. The enable signal EN may be generated based on the signal to the first IO input A 422 and the second IO input B 424. If the input signal is a low-power signal, then LPRX 402 is enabled and HSRX 404 is disabled. If the input signal is a high-speed signal, then HSRX 404 is enabled and LPRX 402 is disabled. More critically, if the input signal is a low-power signal, then LPRX 402 is enabled and HSRX 404 is decoupled from the one or more IO inputs, e.g., the first IO input A 422 and the second IO input B 424, by the isolation block 406. If the input signal is a high-speed signal, then HSRX 404 is coupled to the one or more IO inputs, e.g., the first IO input A 422 and the second IO input B 424, through the isolation block 406 and LPRX 402 is disabled.

Figure 5:
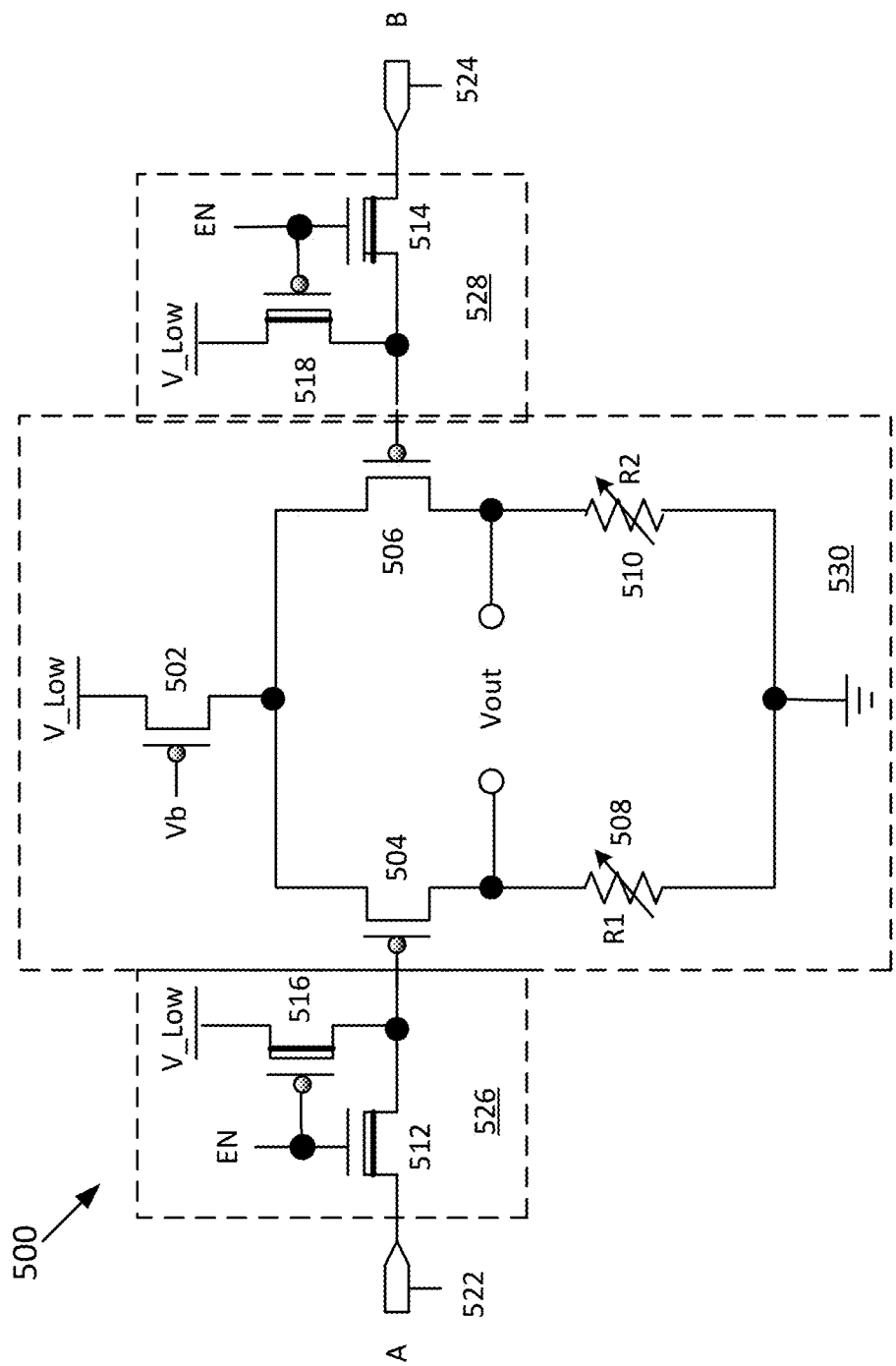
FIG. 5 illustrates an exemplary high-speed circuit according to certain aspects of the present disclosure.

FIG. 5 illustrates an exemplary high-speed circuit according to certain aspects of the present disclosure. The circuit 500 comprises a first isolation circuit 526, a second isolation circuit 528, and a high-speed receiver HSRX 530. The circuit 500 may be used for the isolation block 406 and the second receiver HSRX 404. The first isolation circuit 526 comprises a pass-gate, e.g., an NMOS transistor 512 with one drain/source coupled to a first IO input A 522 and another drain/source coupled to the differential input of the high-speed receiver HSRX 530. In addition, the first isolation circuit 526 may also comprise a pull-up gate, e.g., a PMOS transistor 516 with source coupled to a core supply voltage V_Low and drain coupled to the differential input of the high-speed receiver HSRX 530. Both the pass-gate 512 and the pull-up gate 516 are controlled by an enable signal EN. In response to the enable signal EN, either the pass-gate 512 is enabled and the pull-up gate 516 is off, coupling the first IO input A 522 with the differential input of the high-speed receiver HSRX 530 and decoupling the core supply voltage V_Low from the differential input, or the pass-gate 512 is disabled and the pull-up gate 516 is on, decoupling the first IO input A 522 from the differential input of the high-speed receiver HSRX 530 and coupling the core supply voltage V_Low to the differential input (and pull the differential input to the core supply voltage V_Low). Both the pass-gate 512 and the pull-up gate 516 are designed with thick oxide transistors, or IO transistors as it couples directly with the IO pads, such as the first IO input A 522 and the second IO input B 524.

The second isolation circuit 528 shares the same design as the first isolation circuit 526, comprising a pass-gate, e.g., an NMOS transistor 514, and a pull-up gate, e.g., a PMOS transistor 518. It functions similarly as the first isolation circuit 526. The second isolation circuit 528, in response to enable signal EN, either couples or decouples another differential input node of the high-speed receiver HSRX 530 with the second IO input B 524.

The high-speed receiver HSRX 530 is similar to the CSI receiver 300 except that the transistors used are thin oxide transistors or core transistors. The power supply is a low supply voltage or core supply voltage V_Low. The high-speed receiver 530 comprises a differential pair PMOS transistors 504 and 506, respectively. PMOS transistors 504 and 506 couple to the first and second isolation circuits 526 and 528, respectively. Resistors R1 508 and R2 510 are used as load to the differential pair PMOS transistors 504 and 506. In addition, a PMOS transistor 502 couples to the differential pair and serves to generate a bias current. The gate of the PMOS transistor 502 couples to a bias voltage Vb. The bias voltage can be a fraction of the supply voltage (e.g., ⅓) or can be tied to the ground. The bias voltage Vb may optionally be enable signal EN. If the bias voltage Vb is the enable signal EN, since the PMOS transistor 502 is a thin oxide transistor, the signal must at logic of low supply voltage V_Low, a level shifting circuit may be needed to convert an enable signal from V_High to V_Low. Both speed and power optimization are achieved through the use of thin oxide transistors and low supply voltage for the high-speed receiver 530.

Figure 6:
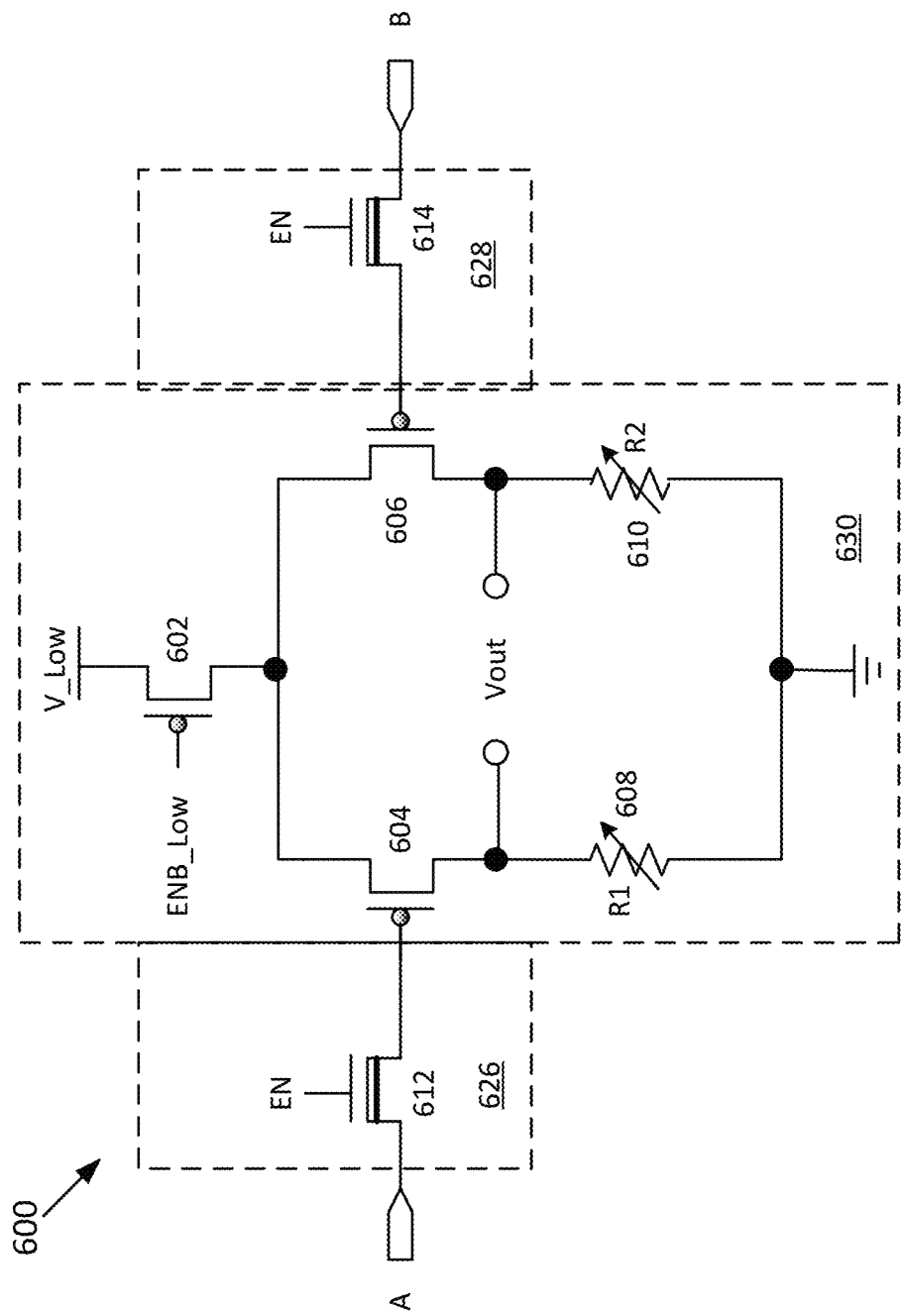
FIG. 6 illustrates another exemplary high-speed circuit according to certain aspects of the present disclosure.

FIG. 6 illustrates another exemplary high-speed circuit according to certain aspects of the present disclosure. In the circuit 600, unlike the circuit 500, the isolation circuits 626 and 628 do not have the pull-up gates. Instead, when the pass-gates 612 and 614 are disabled in response to enable signal EN, the inputs to the high-speed receiver HSRX 630 may be floating. Therefore it is necessary to shut off the high-speed receiver HSRX 630 to avoid unintended power consumption. To achieve such an effect, the bias generator PMOS transistor 602 is also disabled in response to a level-shifted enable signal ENB Low so the high-speed receiver 630 is disabled. Like the high-speed receiver 530, the high-speed receiver 630 is designed with thin oxide transistors or core transistors and is provided with a low supply voltage or core supply voltage V_Low to achieve both speed and power optimization.

Figure 7:
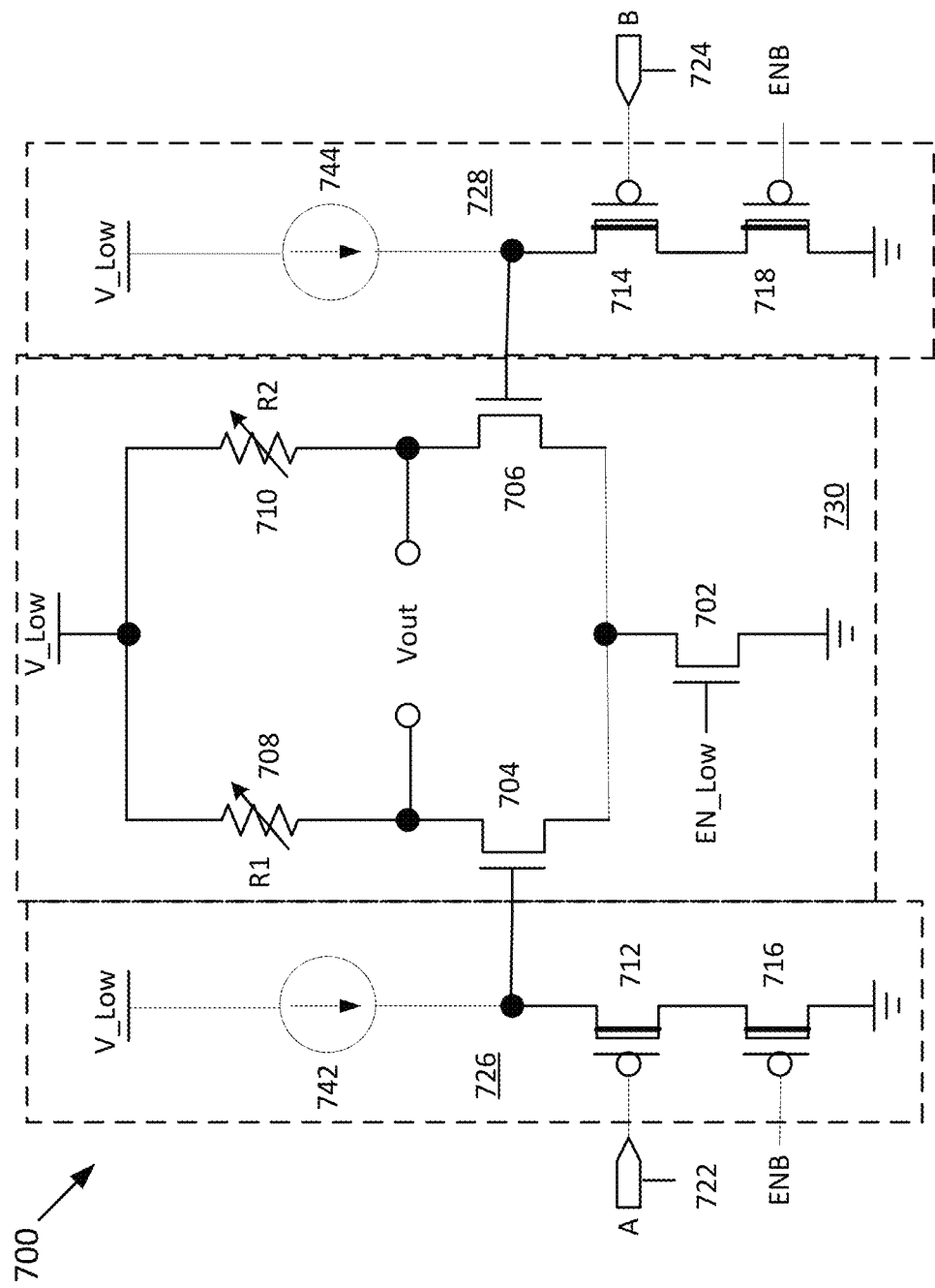
FIG. 7 illustrates yet another exemplary high-speed circuit according to certain aspects of the present disclosure

FIG. 7 illustrates yet another exemplary high-speed circuit according to certain aspects of the present disclosure. The circuit 700 comprises a first isolation circuit 726, a second isolation circuit 728, and a high-speed receiver HSRX 730. The circuit 700 may be used for the isolation block 406 and the second receiver HSRX 404. The high-speed receiver HSRX 730 comprises a differential pair, a load, and a bias current generator. The differential pair is formed by two NMOS transistors 704 and 706. The load is two resistors R1 708 and R2 710 coupled to the differential pair of NMOS transistors 704 and 706, respectively. The bias current is generated by an NMOS transistor 702 coupled to the differential pair. The bias current generator 702 also doubles as a switch to enable or disable the high-speed receiver HSRX 730 in response to an enable signal EN_Low. The transistors used for the high-speed receiver HSRX 730 are thin oxide transistors or core oxide transistors. The supply voltage for the high-speed receiver HSRX 730 is low supply voltage or core supply voltage V_Low. Correspondingly, the enable signal EN_Low is with low supply voltage level V_Low. The enable signal EN_Low may be level-shifted from enable signal EN.

The isolation circuits 726 and 728 respectively couple to a first IO input A 722 and a second IO input B 724 and each couples to one of the differential inputs of the high-speed receiver HSRX 730. The isolation circuits 726 and 728 are source followers to shift the common mode of the input signal at the first input IO A 722 and the second IO input B 724 higher so that the signal can drive the NMOS differential pair 704 and 706. For the first isolation circuit 726, the source follower is formed by a current source load 718, a PMOS transistor 712 with source coupled to the current source load 742, drain coupled to a switch 716, and gate coupled to the first IO input A 722. The switch 716 may be an NMOS transistor or a PMOS transistor with gate coupled to an enable signal ENB. The second isolation circuit 728 shares the same design as the first isolation circuit 726, comprising a current source load 744, a PMOS transistor 714, and a switch 718.

In response to the enable signal ENB (and its corresponding level shift signal or complementary signal EN_Low), the isolation circuits 726 and 728 and the high-speed receiver HSRX 730 are either disabled or enabled.

Similar to the circuits 500 and 600, the isolation circuits 726 and 728 are designed with thick oxide transistors or IO transistors while the high-speed receiver 730 is designed with thin oxide transistors or core transistors to achieve area, speed and power optimization without compromising the reliability.

Figure 8:
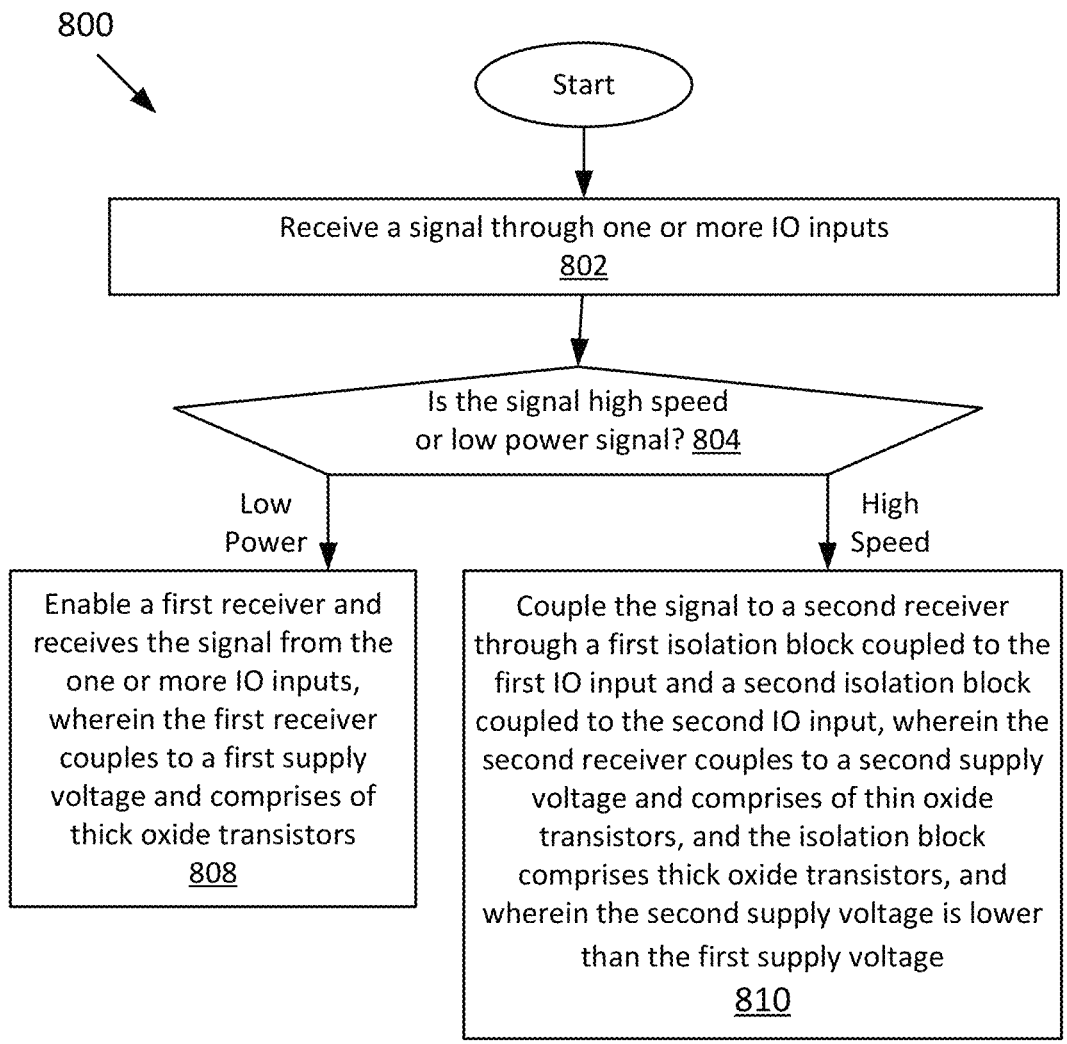
FIG. 8 illustrates an exemplary method for receiving CSI signal according to certain aspects of the present disclosure.

FIG. 8 illustrates an exemplary method for receiving CSI signal according to certain aspects of the present disclosure. The method 800 starts at 802 where a signal is received through one or more IO inputs (e.g., the first IO input 422 and the second IO input 424). The one or more IO inputs are IO pads that serve as interface to off chip components (e.g., a camera module). At 804, it is determined whether the signal is a high-speed signal or a low-power signal. The determination may be done through specific control module by analyzing the received signal. Alternatively, it may be determined through another signal sent through the CSI interface. Other means may be used, too. An enable signal (or its complement) (e.g., the enable signal EN, ENB) may be generated. If the signal is a low-power signal, at 808, in response to the enable signal, a first receiver (e.g., the first receiver 202, 300 or 402) is enabled and receives the signal from the one or more IO inputs. The first receiver is a low-power receiver that couples to a first supply voltage (or IO supply voltage) and comprises of thick oxide transistors or IO transistors. If the signal is a high-speed signal, then at 810, in response to the enable signal, a second receiver (e.g., the second receiver 404, 530, 630, or 730) is coupled to the one or more IO inputs through an isolation block (e.g., the isolation block 406). The isolation block may comprise a first isolation circuit (e.g., the first isolation circuit 426, 526, 626, or 726) and a second isolation circuit (e.g., the second isolation circuit 428, 528, 628, or 728). In addition, at 808, the second receiver is decoupled from the one or more IO inputs; and at 810, the first receiver may be disabled. The second receiver is a high-speed receiver that couples to a second supply voltage (or core supply voltage) and comprises of thin oxide transistors or core transistors. The isolation block comprises thick oxide transistor or IO transistors. The second supply voltage is lower than the first supply voltage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A device, comprising:
one or more IO inputs;
a first receiver coupled to a first supply voltage and the one or more IO inputs, wherein the first receiver comprises thick oxide transistors; and
a circuit comprising:
an isolation block coupled to the one or more IO inputs, wherein the isolation block comprises thick oxide transistors; and
a second receiver coupled to the isolation block and a second supply voltage, wherein the second receiver comprises thin oxide transistors, wherein the first receiver is configured to be disabled when the isolation block is configured to couple the one or more IO inputs to the second receiver, and wherein the first receiver is configured to be enabled when the isolation block is configured to decouple the one or more IO inputs from the second receive.

2. The device of claim 1, wherein the first supply voltage is higher than the second supply voltage.

3. The device of claim 1 further comprising an enable signal coupled to the first receiver and the circuit.

4. The device of claim 3, wherein the isolation block is configured to decouple the one or more IO inputs from the second receiver in response to the enable signal.

5. The device of claim 4, wherein the isolation block is configured to decouple the one or more IO inputs from the second receiver when the second receiver is disabled.

6. The device of claim 3, wherein a logic high of the enable signal is at the first supply voltage.

7. The device of claim 3, wherein the enable signal is configured to couple to the second receiver.

8. The device of claim 7, wherein the first receiver is configured to be disabled when the second receiver is enabled and the second receiver is configured to be disabled when the first receiver is enabled.

9. The device of claim 1, wherein the second receiver is configured to operate at a higher data rate than the first receiver.

10. The device of claim 1 further comprising ESD (Electrostatic Discharge) circuitry coupled to the one or more IO inputs.

11. The device of claim 1, wherein the one or more IO inputs comprises a first IO input and a second IO input, and wherein the isolation block comprises a first isolation circuit coupled to the first IO input and a second isolation circuit coupled to the second IO input.

12. The device of claim 11, wherein the first isolation circuit comprises a pass-gate having a pass-gate input coupled to the first IO input and a pass-gate output coupled to a differential input of the second receiver and a pass-gate control coupled to an enable signal.

13. The device of claim 12, wherein the first isolation circuit further comprises a pull-up gate having a gate coupled to the enable signal, wherein the pull-up gate is configured to pull the differential input to the second supply voltage in response to the enable signal.

14. The device of claim 13, wherein the pass-gate is configured to enabled while the pull-up gate is configured to disabled in response to the enable signal, and wherein the pass-gate is configured to disabled while the pull-up gate is configured to enabled in response to the enable signal.

15. The device of claim 11, wherein the second receiver comprises a differential pair coupled to the first IO input and the second IO input through the first isolation circuit and the second isolation circuit.

16. The device of claim 15, wherein the differential pair comprises two PMOS transistors.

17. The device of claim 11, wherein the first isolation circuit comprises a source follower having an input coupled to the first IO input and an output coupled to a differential input of the second receiver.

18. The device of claim 17, wherein the second receiver comprises a differential pair coupled to the differential input and wherein the differential pair comprises two NMOS transistors.

19. The device of claim 1 wherein the first receiver comprises a single-ended output and the second receiver comprises a differential output.

20. The device of claim 1 wherein the one or more IO inputs is configured to couple to a camera.

21. A method, comprising:
receiving a signal through one or more IO inputs;
enabling a first receiver if the signal is a first type signal or coupling the signal to a second receiver through an isolation block coupled to the one or more IO inputs if the signal is a second type signal, wherein the first receiver couples to a first supply voltage and comprises of thick oxide transistors, the second receiver couples to a second supply voltage and comprises of thin oxide transistors, and the isolation block comprises thick oxide transistors; and
disabling the first receiver if the signal is the second type signal and decoupling signal from the second receiver if the signal is the first type signal.

22. The method of claim 21, wherein the first supply voltage is higher than the second supply voltage.

23. The method of claim 21, wherein the second receiver is configured to operate at a higher data rate than the first receiver.

24. The method of claim 21, wherein the one or more IO inputs couple to ESD circuitry.

25. The method of claim 21, wherein the second receiver comprises a differential pair coupled to the one or more IO inputs through the isolation block.

26. The method of claim 25, wherein the differential pair comprises two PMOS transistors.

27. The method of claim 21, wherein the one or more IO inputs comprises a first IO input and a second IO input and wherein the isolation block comprises a first isolation circuit coupled to the first IO input and a second isolation circuit coupled to the second IO input.

28. The method of claim 27, wherein the first isolation circuit comprises a source follower having an input coupled to the first IO input and an output coupled to a differential input of the second receiver.

29. The method of claim 28, wherein the second receiver comprises a differential pair coupled to the differential input and wherein the differential pair comprises two NMOS transistors.

30. The method of claim 21 wherein the one or more IO inputs is configured to couple to a camera.

31. An apparatus, comprising:
one or more IO inputs;
a first receiver coupled to a first supply voltage and the one or more IO inputs, wherein the first receiver comprises thick oxide transistors;
a second receiver coupled to a second supply voltage, wherein the second receiver comprises thick oxide transistors;
means for coupling or decoupling the second receiver to the one or more IO inputs; and means for disabling the first receiver if a signal in the one or more IO inputs is a high-speed signal.

32. The apparatus of claim 31, wherein the first supply voltage is higher than the second supply voltage.

33. The apparatus of claim 31, wherein the second receiver is configured to operate at a higher data rate than the first receiver.

34. The apparatus of claim 31, wherein the one or more IO inputs couples to ESD circuitry.

35. The apparatus of claim 31, wherein the second receiver comprising a differential pair coupled to the one or more IO inputs through the means for coupling or decoupling the second receiver to the one or more IO inputs.

36. The apparatus of claim 35, wherein the differential pair comprises two PMOS transistors.

37. The apparatus of claim 31, wherein the means for coupling or decoupling the second receiver to the one or more IO inputs comprises a source follower having an input coupled to the one or more IO inputs and an output coupled to a differential input of the second receiver.

38. The apparatus of claim 37, wherein the second receiver comprises a differential pair coupled to the differential input and wherein the differential pair comprises two NMOS transistors.

39. The apparatus of claim 31 wherein the one or more IO inputs is configured to couple to a camera.

\* \* \* \* \*